United States Patent
Sadovnikov et al.

(10) Patent No.: US 7,132,342 B1
(45) Date of Patent: Nov. 7, 2006

(54) METHOD OF REDUCING FRINGING CAPACITANCE IN A MOSFET

(75) Inventors: Alexei Sadovnikov, Sunnyvale, CA (US); Peter Johnson, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/003,094

(22) Filed: Dec. 3, 2004

(51) Int. Cl.
*H01L 21/336* (2006.01)
(52) U.S. Cl. .................. 438/303; 438/595; 257/E21.64
(58) Field of Classification Search ............... 438/303, 438/595, FOR. 438, FOR. 199, E21.64
See application file for complete search history.

(56) References Cited

U.S. PATENT DOCUMENTS

| 5,915,182 A | * | 6/1999 | Wu | 438/299 |
| 6,468,877 B1 | * | 10/2002 | Pradeep et al. | 438/421 |

* cited by examiner

*Primary Examiner*—George R. Fourson
*Assistant Examiner*—Julio J. Maldonado
(74) *Attorney, Agent, or Firm*—Jurgen Vollrath

(57) ABSTRACT

In a method of reducing the fringing capacitance of a MOSFET, the nitride spacers on the sides of the MOSFET gate are etched away to form trenches, which are plugged to define air spacers.

5 Claims, 1 Drawing Sheet

METHOD OF REDUCING FRINGING CAPACITANCE IN A MOSFET

FIELD OF THE INVENTION

The invention relates to MOSFET devices. In particular it relates to a method of reducing gate-source and gate-drain capacitance in a MOSFET device.

BACKGROUND OF THE INVENTION

As shown in FIG. 1, standard CMOS devices typically include a drain region 100 and a source region 102 formed on either side of a polysilicon gate 104, which is separated from the substrate by an oxide layer 106. Contact to the drain 100 and source 102 is achieved through a silicide layer 108. To ensure that the gate 104 and drain and source silicide 108 are not shorted a spacer is formed on either side of the gate 104 prior to forming the drain region 100 and source region 102 and prior to silicidation. Each spacer comprises an oxide liner 110 and a nitride spacer 112 as shown in FIG. 1. Since the bottom portions of the spacers adjacent the polysilicon gate 104 largely dictate the gate-drain capacitance and gate-source capacitance (also referred to as the fringing capacitance), it will be appreciated that the fringing capacitance can be reduced by increasing the width of the spacer. However, since this also increases source and drain resistance, the oxide liner has typically been limited to a thickness of about 200 Å and the nitride spacer thickness or length to about 1000 Å.

SUMMARY OF THE INVENTION

According to the invention there is provided a method of reducing the fringing capacitance of a MOSFET device, comprising forming an air spacer on one or both sides of the gate of the device. This may include first forming an oxide liner and optionally a nitride spacer along both sides of the gate, as is known in the art, depositing an additional oxide layer, for at least one side of the gate, etching away at least part of one or both of the nitride spacer and oxide liner to leave a trench on the at least one side of the gate, and plugging the top of the trench to define an air spacer. The method may include etching back the additional oxide layer to expose upper ends of the nitride spacers. The method may further include forming a silicide layer on the gate and on the outside of the spacers formed by the oxide liner and nitride spacer prior to depositing the additional oxide layer and using the silicide layer as an etch-stop layer during etching back of the additional oxide layer. The etching away of at least part of one or both of the nitride spacer and oxide liner may include a selective nitride wet etch and a selective oxide wet etch. Preferably the nitride spacer is etched away entirely and the oxide liner is dipped off to reduce oxide thickness at the bottom corner adjacent the gate. The plugging of the trench may include depositing a thin oxide layer over the trench.

DETAILED DESCRIPTION OF THE INVENTION

Figure 1:
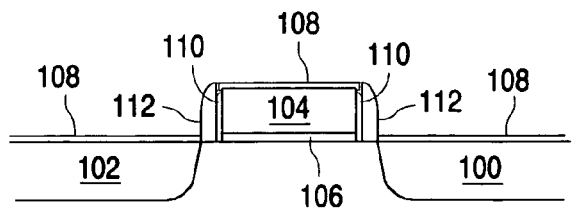
FIG. 1 is a sectional view through a typical MOSFET known in the art.
Figure 2:
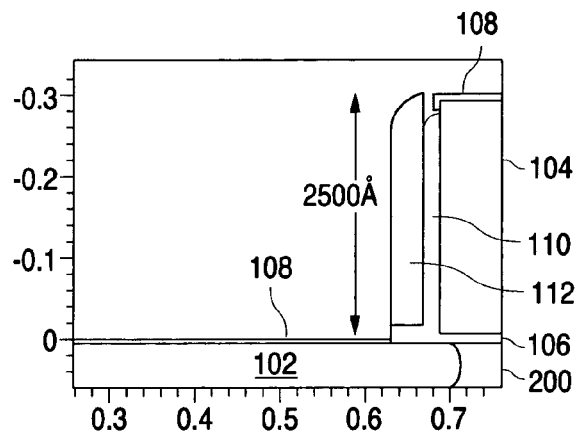
FIG. 2 is an enlarged view of the left hand side of the MOSFET of FIG. 1.

FIG. 2 shows an enlarged view of the left hand side of a typical MOSFET as known in the art just after silicidation in which a silicide layer 108 is formed on all silicon regions, including the polysilicon gate 104 and the source 102 (the drain 100 is not shown in FIG. 2). A typical MOSFET at this stage of the process includes a gate oxide layer 106 between the polysilicon gate 104 and the substrate 200.

As discussed above, typical MOSFET at this stage of the process includes a gate oxide layer 106 between the gate poly of gate 104 and the substrate 200. It also includes a spacer on both sides of the gate 104 (only the left hand spacer is shown in FIG. 2). Each spacer includes an oxide liner 110 and a nitride spacer 112.

Figure 3:
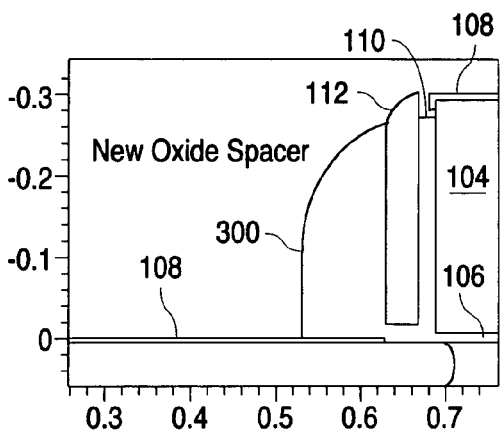
FIGS. 3–5 show the process steps involved in forming one embodiment of a MOSFET device of the present invention.

According to the invention, an extra oxide layer is deposited at this stage and is then etched back using the silicide layer 108 as an etch stop, thereby defining a new oxide spacer 300 as shown in FIG. 3.

Figure 4:
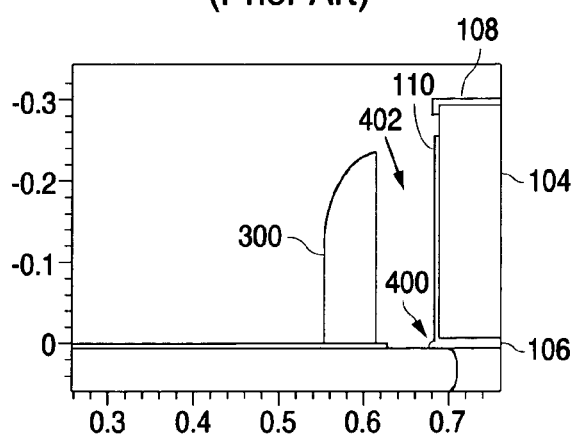

The nitride spacer 112 is then etched away using a nitride selective wet etch. The oxide liner 110 is then dipped off using an oxide selective wet etch to reduce the oxide thickness at the bottom corner of the spacer adjacent the gate, as indicated by reference numeral 400 in FIG. 4. It will be appreciated that if an air spacer is also formed on the drain side, the same etching steps would be performed on the right hand side of the gate. In this embodiment all of the nitride spacer 112 and much of the oxide liner 110 were etched away to leave a trench 402. It will be appreciated that in different embodiments only parts of the spacer material can be etched away and that the etching away of all or parts of the spacer material may be performed on both or only on the drain side or only on the source side.

Figure 5:
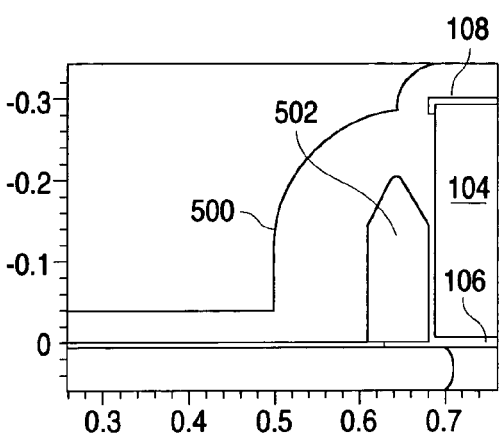

In order to plug the trench 402 a thin film oxide 500 is deposited over the structure as shown in FIG. 5. A typical gate is of the order of 2000 to 2500 Å in height. Thus, the aspect ratio is typically between 4 to 1 and 6 to 1. With such a large aspect ratio the deposition plugs the trench a the top to create a void or air spacer 502 below as shown in FIG. 5. In this way an air spacer is formed, and since air with a permittivity of one has a much higher permittivity than oxide or nitride, the air spacer reduces fringing capacitance of the MOSFET and thus increases the speed of the MOSFET.

While the embodiment above concentrated on the forming of an air spacer on the left hand side (in this case the source side) it will be appreciated that it is usually desirable to also achieve the benefits of a lower gate-drain capacitance by also forming an air spacer on the drain side of the gate. It will also be appreciated that while the present embodiment formed the air spacers after the nitride spacers and silicide layer had been formed, other approaches and steps can be taken to creating the air spacers.

What is claimed is:

1. A method of reducing the fringing capacitance of a MOSFET device, comprising forming an air spacer on one or both sides of the gate of the device, wherein forming each air spacer includes
first forming an oxide liner along one side of the gate, forming a nitride spacer adjacent the oxide liner,
depositing an additional oxide layer over said side of the gate,
etching away at least part of the oxide liner and at least part of the nitride spacer to leave a trench on the side of the gate, and
plugging the top of the trench to define an air spacer.

2. A method of claim 1, further comprising etching back the additional oxide layer to expose upper end of the nitride spacer.

3. A method of claim 2, further comprising forming a silicide layer on the gate and toward the outside of the one or more spacers as defined by the oxide liner and nitride spacer, prior to depositing the additional oxide layer, using the silicide layer as an etch-stop layer during etching back of the additional oxide layer.

4. A method of claim 1, wherein the etching of each nitride spacer includes a selective nitride wet etch, and the etching of each oxide liner includes a selective oxide wet etch.

5. A method of claim 1, wherein the nitride spacer is etched away entirely and the oxide liner is dipped off to reduce oxide thickness at least at the bottom corner adjacent the gate.

* * * * *